US010192682B1

(12) United States Patent
Park et al.

(10) Patent No.: US 10,192,682 B1
(45) Date of Patent: Jan. 29, 2019

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/838,988

(22) Filed: Dec. 12, 2017

(30) Foreign Application Priority Data

Jul. 25, 2017 (KR) ........................ 10-2017-0093986

(51) Int. Cl.
*H01G 2/06* (2006.01)
*H01G 2/14* (2006.01)
*H01G 2/22* (2006.01)
*H01G 4/12* (2006.01)
*H01G 4/30* (2006.01)
*H05K 1/18* (2006.01)
*H01G 4/012* (2006.01)
(Continued)

(52) U.S. Cl.
CPC ................. *H01G 2/06* (2013.01); *H01G 2/14* (2013.01); *H01G 2/22* (2013.01); *H01G 4/012* (2013.01); *H01G 4/12* (2013.01); *H01G 4/30* (2013.01); *H05K 1/0259* (2013.01); *H05K 1/111* (2013.01); *H05K 1/181* (2013.01)

(58) Field of Classification Search
CPC .. H01G 2/06; H01G 2/14; H01G 2/22; H01G 4/012; H01G 4/12; H01G 4/30; H05K 1/0259; H05K 1/181
USPC ........................................................ 361/272
See application file for complete search history.

(56) References Cited

U.S. PATENT DOCUMENTS 6,270,613 B1    8/2001  Nakagawa et al.
2011/0286142 A1  11/2011  Ikeda
(Continued)

FOREIGN PATENT DOCUMENTS

JP          11-45837 A      2/1999
JP        2000-114005 A     4/2000
(Continued)

*Primary Examiner* — Michael P McFadden
(74) *Attorney, Agent, or Firm* — McDermott Will & Emery LLP

(57) ABSTRACT

The composite electronic component includes: a multilayer capacitor; an electrostatic discharge (ESD) protecting element; and first to fourth conductive resin layers, The multilayer capacitor includes: a capacitor body including dielectric layers and a plurality of first and second internal electrodes alternately disposed with respective dielectric layers interposed therebetween; first and second external electrodes connected to exposed portions of the first internal electrodes; and third and fourth external electrodes connected to exposed portions of the second internal electrodes. The ESD protecting element includes: a discharge portion disposed on the first surface of the capacitor body to be connected to the first to fourth external electrodes; and a protective layer. The first to fourth conductive resin layers are formed on the first to fourth external electrodes, respectively, and extend to portions of a first surface of the protective layer, respectively.

14 Claims, 8 Drawing Sheets

(51) Int. Cl.
*H05K 1/02* (2006.01)
*H05K 1/11* (2006.01)

(56) References Cited

U.S. PATENT DOCUMENTS

| | | | |
|---|---|---|---|
| 2012/0134059 A1 | 5/2012 | Sumi et al. | |
| 2015/0325371 A1* | 11/2015 | Hattori | H01G 4/385 |
| | | | 361/301.4 |
| 2015/0340154 A1* | 11/2015 | Kim | H01G 2/14 |
| | | | 174/260 |

FOREIGN PATENT DOCUMENTS

| | | |
|---|---|---|
| JP | 2011-243492 A | 12/2011 |
| KR | 10-2015-0135909 A | 12/2015 |
| WO | 2011/024780 A1 | 3/2011 |

\* cited by examiner

COMPOSITE ELECTRONIC COMPONENT AND BOARD HAVING THE SAME

CROSS-REFERENCE TO RELATED APPLICATION(S)

This application claims benefit of priority to Korean Patent Application No. 10-2017-0093986 filed on Jul. 25, 2017 in the Korean Intellectual Property Office, the disclosure of which is incorporated herein by reference in its entirety.

TECHNICAL FIELD

The present disclosure relates to a composite electronic component and a board having the same.

BACKGROUND

Recently, due to technological progress in the area of in-vehicle infotainment (IVI) systems as well as advanced driver assistance systems (ADAS), in accordance with the rapid progress of vehicle electronics, the number of electronic control units (ECUs), camera modules, and sensor units mounted in vehicles has rapidly increased.

Further, in accordance with the evolution and complexification of interfaces or a networks in vehicles for connections between ECUs, studies into improvements of communications speeds and improvements of efficiency have been conducted.

Thereamong, strict reliability and durability are required in respective ECUs. Since such ECUs are in charge of general management and control of a vehicle driving system, they are directly associated with the driving properties and stability of vehicles.

Due to a severe use environment of ECUs, a rapid temperature change in ECUs is generated at high temperatures, and ECUs may be exposed to mechanical stress such as vibrations, impacts, or the like, for long periods of time. In addition, an electromagnetic environment such as an over-voltage due to a surge generated in a reactor constituting an actuator, an electrostatic discharge (ESD), or the like, may also be severe.

Therefore, electronic components constituting ECUs guarantee electrical performance in a use environment of the ECUs, and a reliability test and a durability test of the electronic components for use over a long period of time should thus be mandatorily performed, and passive components have also been required to have high reliability and to be safely designed.

Further, it has also been required to secure stability of electronic components against mechanical stress or electrical stress that is sudden and beyond expectation. In addition, in accordance with the spread and evolution of IVI systems or ADAS, demand for passive components having high stability and high reliability components to which an overlapping design is applied has continuously increased.

Products having excellent thermal or electrical reliability may be selected as the passive components mounted in the ECUs.

In order for reliability of the ECUs to satisfy a guarantee condition of a vehicle, products of which sufficient stability for an over-voltage exceeding a withstand voltage specification as well as mechanical stress such as warpage of a board, thermal impact, or the like, is guaranteed should be used.

SUMMARY

An aspect of the present disclosure may provide a composite electronic component in which an electrostatic discharge (ESD) absorbing effect and resistance to ESD are improved, mechanical strength is improved, and a mounting area of a component on a board may be reduced in spite of using an ESD element, and a board having the same.

According to an aspect of the present disclosure, a composite electronic component may include: a multilayer capacitor; an electrostatic discharge (ESD) protecting element; and first to fourth conductive resin layers. The multilayer capacitor includes: a capacitor body including dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, the first internal electrodes being exposed through the third and fourth surfaces and the second internal electrodes being exposed through the fifth and sixth surfaces; first and second external electrodes extending from the third and fourth surfaces of the capacitor body to portions of the first surface of the capacitor body, respectively, and connected to exposed portions of the first internal electrodes; and third and fourth external electrodes extending from the fifth and sixth surfaces of the capacitor body to portions of the first surface of the capacitor body, respectively, and connected to exposed portions of the second internal electrodes. The ESD protecting element includes: a discharge portion disposed on the first surface of the capacitor body to be connected to the first to fourth external electrodes; and a protective layer disposed to cover the discharge portion. The first to fourth conductive resin layers are formed on the first to fourth external electrodes, respectively, and extend to portions of a first surface of the protective layer, respectively.

The ESD protecting element may further include: first and second lead electrodes disposed on the first surface of the capacitor body to be connected to the first and second external electrodes, respectively; and a third lead electrode disposed on the first surface of the capacitor body to connect the third and fourth external electrodes to each other, and the first and second lead electrodes may be spaced apart from the third lead electrode.

The first to fourth external electrodes of the multilayer capacitor may extend to portions of the first surface of the capacitor body, respectively.

The first internal electrodes may include first and second internal conductors spaced apart from each other and exposed through the third and fourth surfaces of the capacitor body, respectively, and the ESD protecting element may further include a fourth lead electrode disposed on the first surface of the capacitor body to connect the first and second external electrodes to each other and to not be connected to the third and fourth external electrodes.

The first surface of the capacitor body may be a mounting surface.

The discharge portion may include a conductive polymer.

The protective layer may include an epoxy-based resin.

The composite electronic component may further include first and fourth plating layers formed on the first to fourth conductive resin layers, respectively.

According to another aspect of the present disclosure, a board having a composite electronic component may include: a circuit board having a plurality of electronic components disposed thereon; and the composite electronic component as described above mounted on the circuit board so that external electrodes of the composite electronic component are connected to the electrode pads.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Composite Electronic Component

Figure 1:
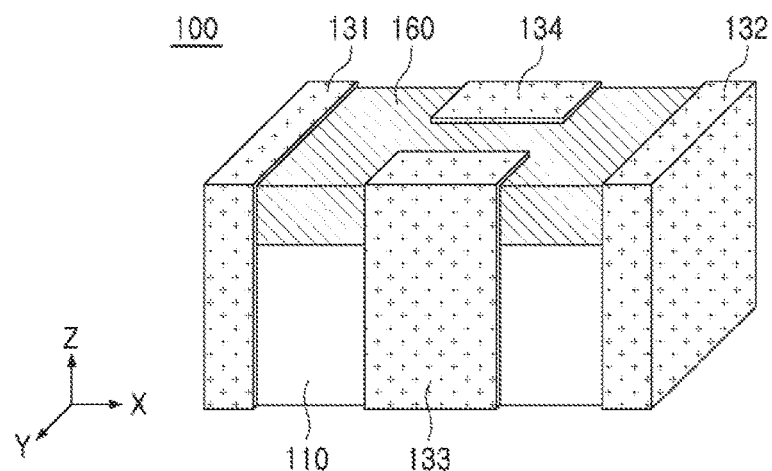
FIG. 1 is a schematic perspective view illustrating a composite electronic component according to an exemplary embodiment in the present disclosure.
Figure 2:
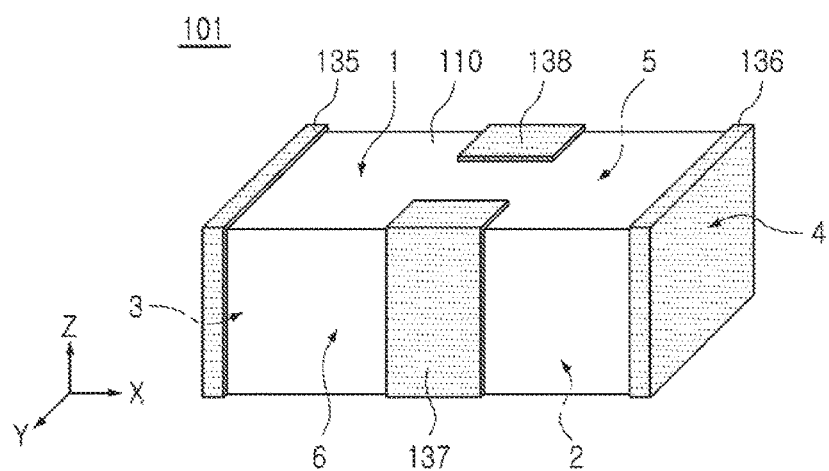
FIG. 2 is a perspective view illustrating a multilayer capacitor used in FIG. 1.
Figure 4:
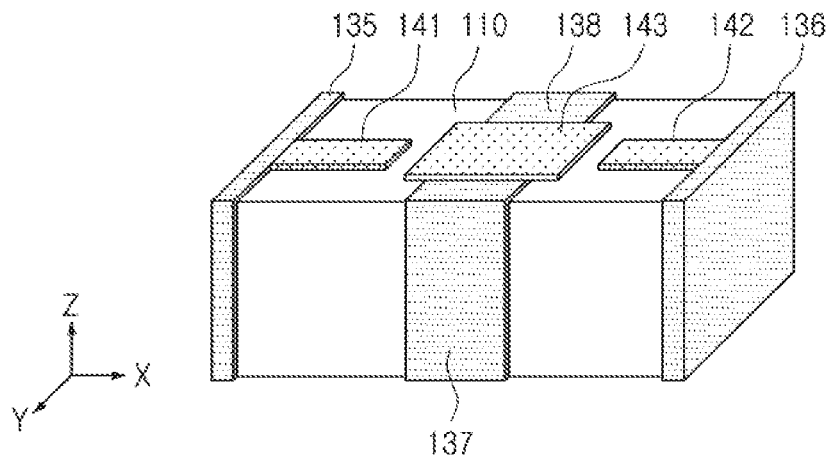
FIG. 4 is a perspective view illustrating a state in which first to third lead electrodes are disposed in FIG. 2.
Figure 5:
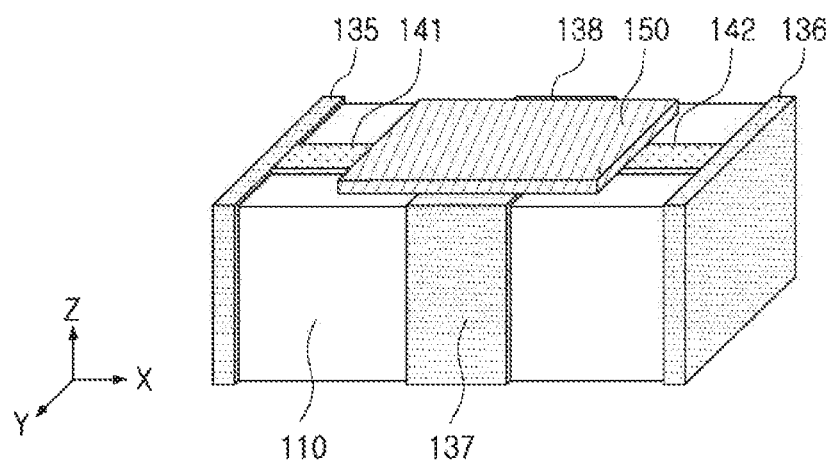
FIG. 5 is a perspective view illustrating a state in which a discharge portion is disposed in FIG. 4.
Figure 6:
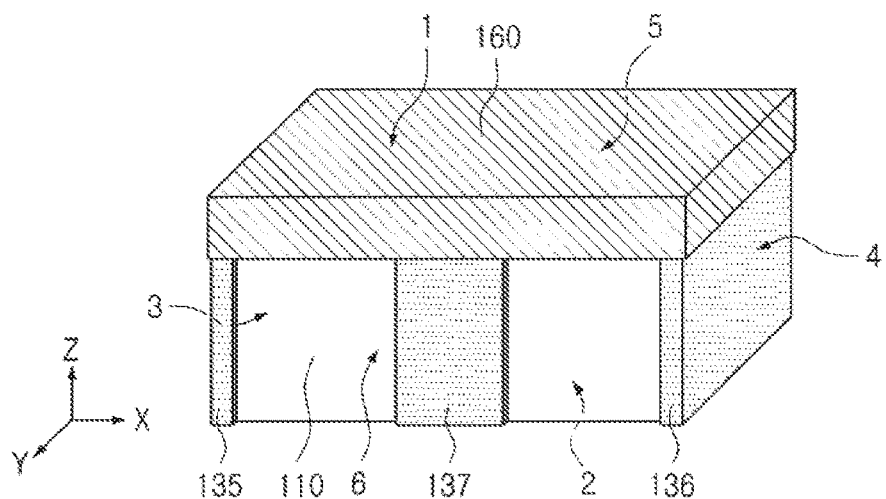
FIG. 6 is a perspective view illustrating a state in which a protective layer is further disposed in FIG. 5.

FIG. 1 is a schematic perspective view illustrating a composite electronic component according to an exemplary embodiment in the present disclosure, FIG. 2 is a perspective view illustrating a multilayer capacitor used in FIG. 1, FIG. is a schematic exploded perspective view illustrating structures of first and second internal electrodes of the multilayer capacitor of FIG. 2, FIG. 4 is a perspective view illustrating a state in which first to third lead electrodes are disposed in FIG. 2, FIG. 5 is a perspective view illustrating a state in which a discharge portion is disposed in FIG. 4, and FIG. 6 is a perspective view illustrating a state in which a protective layer is further disposed in FIG. 5.

In a composite electronic component 100 according to an exemplary embodiment in the present disclosure, a 'length direction' refers to an 'X' direction of FIG. 1, a 'width direction' refers to a 'Y' direction of FIG. 1, and a 'thickness direction' refers to a 'Z' direction of FIG. 1. Here, the 'thickness direction' refers to a direction in which dielectric layers 111 of a multilayer capacitor 101 are stacked, that is, a 'stacking direction'.

In addition, the length direction, the width direction, and the thickness direction of the composite electronic component 100 may be the same as those of the multilayer capacitor 101 and an electrostatic discharge (ESD) protecting element, as described below.

In addition, in the present exemplary embodiment, a shape of the composite electronic component 100 is not particularly limited, but may be a hexahedral shape as illustrated.

Here, the multilayer capacitor 101 may have first and second surfaces 1 and 2 opposing each other in the Z direction, third and fourth surfaces 3 and 4 connecting the first and second surfaces 1 and 2 to each other and opposing each other in the X direction, and fifth and sixth surfaces 5 and 6 connected to the first and second surfaces 1 and 2, connected to the third and fourth surfaces 3 and 4, and opposing each other in the Y direction.

First to sixth surfaces of the composite electronic component 100 refer to surfaces in the same directions as those of the first to sixth surfaces 1-6 of the multilayer capacitor 101, as described below.

The composite electronic component 100 according to the present exemplary embodiment may have a form in which the multilayer capacitor 101 and the ESD protecting element are coupled to each other. When the ESD protecting element is coupled to a lower portion of the multilayer capacitor 101, a first surface of the composite electronic component 100 refers to the first surface 1 of the multilayer capacitor 101, and a second surface of the composite electronic component 100 refers to the second surface 2 of the multilayer capacitor 101. In the present exemplary embodiment, the first surface 1 of the composite electronic component 100 may be a mounting surface.

Referring to FIG. 1, the composite electronic component 100 according to the exemplary embodiment in the present disclosure may include the multilayer capacitor 101, the ESD protecting element, and first to fourth conductive resin layers 131 to 134.

The composite electronic component 100 according to the present exemplary embodiment may have a form in which the ESD protecting element is disposed on the first surface 1, a mounting surface of a capacitor body 110.

Therefore, a phenomenon in which vibrations generated due to an inverse piezoelectric property of the multilayer capacitor 101 are transferred to a board may be decreased to decrease acoustic noise.

Multilayer Capacitor

Figure 3:
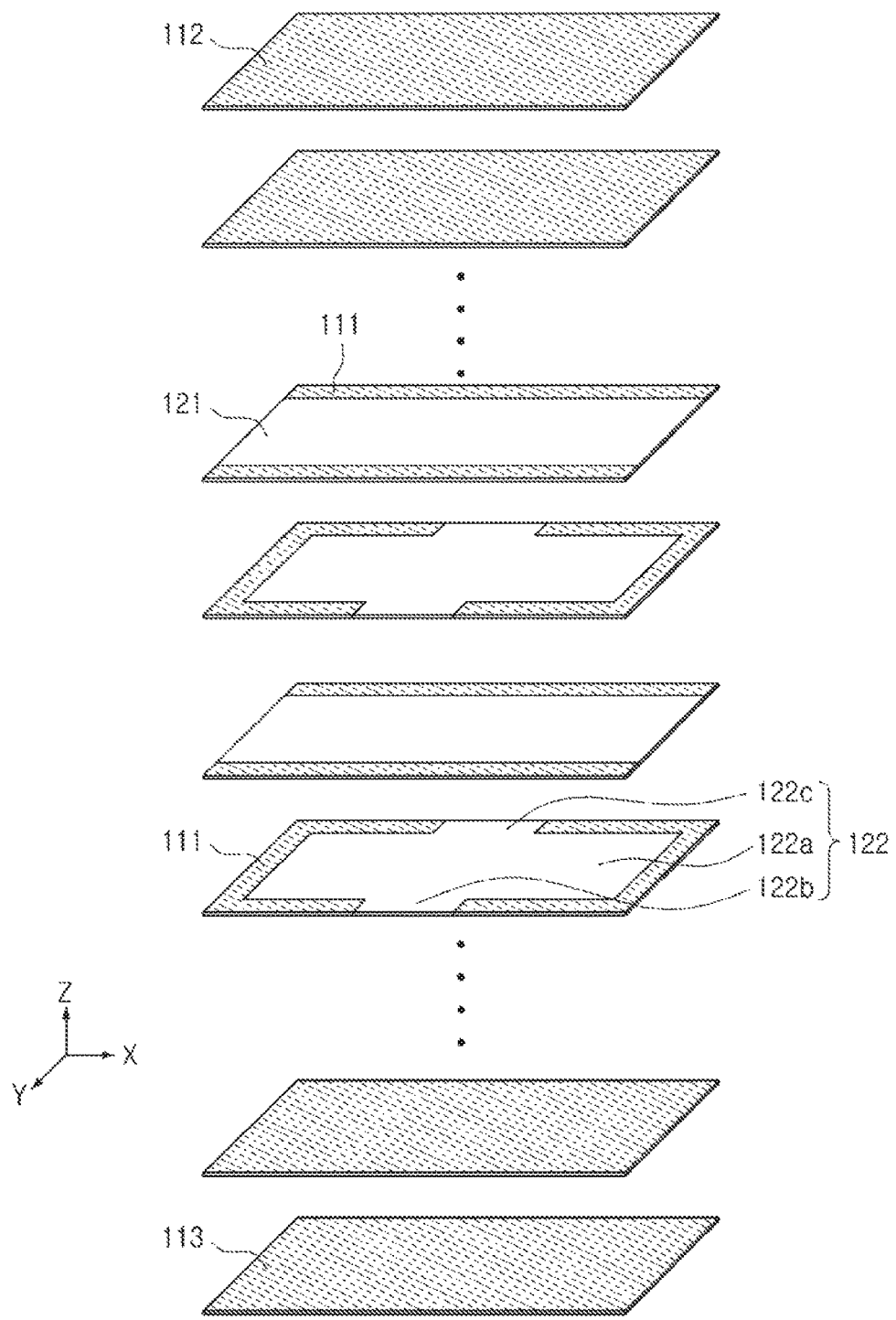
FIG. 3 is a schematic exploded perspective view illustrating structures of first and second internal electrodes of the multilayer capacitor of FIG. 2.

Referring to FIGS. 2 and 3, the multilayer capacitor 101 according to the present exemplary embodiment may include the capacitor body 110 and first to fourth external electrodes 135 to 138.

The capacitor body 110 may include dielectric layers 111 and a plurality of first and second internal electrodes 121 and 122 alternately disposed in the Z direction with respective dielectric layers 111 interposed therebetween.

Here, a plurality of dielectric layers 111 of the capacitor body 110 may be in a sintered state, and adjacent dielectric layers 111 may be integrated with each other so that boundaries therebetween may not be readily apparent.

The dielectric layer 111 may be formed by sintering a ceramic green sheet including ceramic powder particles, an organic solvent, and an organic binder.

The ceramic powder, a material having a high dielectric constant, may be a barium titanate ($BaTiO_3$) based material, a strontium titanate ($SrTiO_3$) based material, or the like, but is not limited thereto.

The capacitor body 110 may have first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other in the Y direction. In this case, the first surface 1 of the capacitor body 110 may be a mounting surface.

The capacitor body 110 may have covers 112 and 113 formed, respectively, at upper and lower portions thereof in the Z direction. The covers 112 and 113 may be formed of the same material as that of the dielectric layer 111 and have the same configuration as that of the dielectric layer 111 except that they do not include the internal electrodes.

The covers 112 and 113 may be formed by stacking a single dielectric layer or two or more dielectric layers on upper and lower surfaces of an active region, respectively, in the Z direction, and may serve to prevent damage to the first and second internal electrodes 121 and 122 due to physical or chemical stress.

Both ends of the first internal electrodes 121 may be exposed through the third and fourth surfaces 3 and 4 of the capacitor body 110, respectively.

The second internal electrodes 122 may have a polarity different from that of the first internal electrodes 121, and may be exposed through the fifth and sixth surfaces 5 and 6 of the capacitor body 110.

To this end, each of the second internal electrodes 122 may include a body portion 122a overlapping the first internal electrode 121 in the Z direction to form capacitance and first and second lead portions 122b and 122c each extending in the body portion 122a in the Y direction and each exposed through the fifth and sixth surfaces 5 and 6 of the capacitor body 110.

The first and second internal electrodes 121 and 122 may be formed by printing a conductive paste including a conductive metal at a predetermined thickness on ceramic green sheets forming the dielectric layers 111, by a printing method such as a screen printing method or a gravure printing method, and may be electrically insulated from each other by the dielectric layers 111 disposed therebetween.

Here, the conductive metal may be nickel (Ni), copper (Cu), palladium (Pd), or alloys thereof, but is not limited thereto.

The first external electrode 135 may be disposed on the third surface 3 of the capacitor body 110, and may extend to a portion of the first surface 1 of the capacitor body 110.

In the present exemplary embodiment, the first external electrode 135 may include a first connection portion formed on the third surface 3 of the capacitor body 110 and in contact with and electrically connected to one ends of the first internal electrodes 121 that are exposed and a first band portion extending from the first connection portion to a portion of the first surface 1 of the capacitor body 110.

Here, the first band portion may extend to a portion of the second surface 2 of the capacitor body 110. In addition, the first band portion may extend to portions of the fifth and sixth surfaces 5 and 6 of the capacitor body 110, if necessary.

The second external electrode 136 may be disposed on the fourth surface 4 of the capacitor body 110, and may extend to a portion of the first surface 1 of the capacitor body 110.

In the present exemplary embodiment, the second external electrode 136 may include a second connection portion formed on the fourth surface 4 of the capacitor body 110 and in contact with and electrically connected to the other ends of the first internal electrodes 121 that are exposed and a second band portion extending from the second connection portion to a portion of the first surface 1 of the capacitor body 110.

Here, the second band portion may extend to a portion of the second surface 2 of the capacitor body 110. In addition, the second band portion may extend to portions of the fifth and sixth surfaces 5 and 6 of the capacitor body 110, if necessary.

The third external electrode 137 may be disposed on the fifth surface 5 of the capacitor body 110, and may extend to a portion of the first surface 1 of the capacitor body 110.

In the present exemplary embodiment, the third external electrode 137 may include a third connection portion formed on the fifth surface 5 of the capacitor body 110 and in contact with and electrically connected to the first lead portions 122b of the second internal electrodes 122 and a third band portion extending from the third connection portion to a portion of the first surface 1 of the capacitor body 110.

Here, the third band portion may extend to a portion of the second surface 2 of the capacitor body 110.

The fourth external electrode 138 may be disposed on the sixth surface 6 of the capacitor body 110, and may extend to a portion of the first surface 1 of the capacitor body 110.

In the present exemplary embodiment, the fourth external electrode 138 may include a fourth connection portion formed on the sixth surface 6 of the capacitor body 110 and in contact with and electrically connected to the second lead portions 122c of the second internal electrodes 122 and a fourth band portion extending from the fourth connection portion to a portion of the first surface 1 of the capacitor body 110.

Here, the fourth band portion may extend to a portion of the second surface 2 of the capacitor body 110.

The first to fourth external electrodes 135 to 138 may include a conductive metal and glass frit, and may be sintered and be electrically connected to the respective corresponding internal electrodes.

ESD Protecting Element

The ESD protecting element may be an ESD suppressor, but is not necessarily limited thereto.

In the present exemplary embodiment, the ESD protecting element may include a discharge portion 150 and a protective layer 160.

In addition, the ESD protecting element may further include first to third lead electrodes 141 to 143 disposed on the first surface 1 of the capacitor body 110.

The first to third external electrodes 141 to 143 may include a conductive metal and glass frit, and may be sintered and be electrically connected to the respective corresponding external electrodes.

The first lead electrode 141 may be connected to the first band portion of the first external electrode 135 formed on the first surface 1 of the capacitor body 110, and the second lead electrode 142 may be formed on the second band portion of the second external electrode 136 formed on the first surface 1 of the capacitor body 110.

The third lead electrode 143 may be disposed to connect the third band portion of the third external electrode 137 and the fourth band portion of the fourth external electrode 138 formed on the first surface 1 of the capacitor body 110 to each other.

In addition, the first and second lead electrodes 141 and 142 may be spaced apart from each other, and the third lead electrode 143 may be spaced apart from each of the first and second lead electrodes 141 and 142.

A varistor, a general electrical overstress (EOS) protecting element, may include an zinc oxide as a raw material and have a form in which palladium (Pd) or silver (Ag) electrodes are stacked while facing each other in the stacking direction with the zinc oxide interposed therebetween.

However, according to the exemplary embodiment in the present disclosure, the first and second lead electrodes 141 and 142 may be disposed on the same plane to face each other. However, the first and second lead electrodes 141 and 142 are not necessarily limited thereto, but may be partially misaligned with each other in the Y direction.

In addition, the first to third external electrodes 141 to 143 may be formed of a conductive paste containing a conductive metal.

The conductive metal may be nickel (Ni), copper (Cu), palladium (Pd), or alloys thereof, but is not limited thereto.

The first to third lead electrodes 141 to 143 may be formed by printing a conductive paste on the capacitor body 100 by a printing method such as a screen printing method or a gravure printing method.

The discharge portion 150 may be disposed on the first surface 1 of the capacitor body 110 to cover portions of the first to fourth external electrodes 135 to 138, and may thus be connected to the first to fourth external electrodes 135 to 138. The discharge portion 150 may be short circuited due to a spark between clearances, generated when a high voltage in a kV unit is generated in a gap between adjacent lead electrodes, resulting in an instantaneous discharge.

In addition, the discharge portion 150 may be formed at an area smaller than that of the first surface 1 of the capacitor body 110. That is, a length and a width of the discharge portion 150 may be smaller than a length of the capacitor body 110 in the X direction and a width of the capacitor body 110 in the Y direction.

Here, the discharge portion 150 may include a resin, conductive particles, piezoelectric particles, and a conductive polymer, and may be manufactured by thermally hardening these materials at a temperature of 150 to 200° C.

Here, the conductive particles may be included in the resin and be maintained in an insulation state at ordinary times. However, when a high voltage is applied, the conductive particles come through the resin, an insulating material, such that a spark is generated between the conductive particles. Therefore, an instantaneous short circuit is generated between clearances, such that a discharge occurs.

The resin may be, for example, an epoxy resin, a phenol resin, a silicone resin, a polyimide resin, and the like, the conductive particles may include at least one of copper (Cu), nickel (Ni), silver (Ag), aluminum (Al), and gold (Au), and the piezoelectric particles may be a zinc oxide (ZnO), a lead oxide (PbO), or the like.

In addition, the conductive polymer may have characteristics of a non-conductor when a signal voltage input from a signal interface, an integrated circuit (IC) block of a power supply terminal, or a communications line through which signals are transferred from a connector to a system or an IC corresponds to a rated voltage (circuit voltage) level, but may have characteristics of a conductor when an over-voltage such as ESD, or the like, is instantaneously generated.

The first lead electrode 141 and the third lead electrode 143 or the second lead electrode 142 and the third lead electrode 143 may be short circuited due to the discharge portion 150 having the characteristics of the conductor when the over-voltage such as the ESD, or the like, is generated.

Therefore, the over-voltage such as the ESD, or the like, may be bypassed to a ground through the ESD protecting element, such that the signal interface, the IC block, or the communications line may be protected.

In addition, the conductive polymer is not particularly limited, but may be, for example, a silicone based resin.

According to the present exemplary embodiment, since the discharge portion 150 includes the conductive polymer, the silicone based resin, the ESD protecting element needs to be coupled to an outer surface of the capacitor body 110, and may not be disposed in the capacitor body 110.

The reason may be that the silicone based resin may be evaporated and removed in a case in which it is disposed in the multilayer capacitor 101 since the silicone based resin has a boiling point significantly lower than a sintering temperature of the capacitor body 101 required at the time of manufacturing the multilayer capacitor 101.

In addition, according to the present exemplary embodiment, the ESD protecting element may bypass the over-voltage such as the EDS, or the like, by the first to third lead electrodes 141 to 143 and the display portion 150, but the varistor may act as an insulator at a rated voltage and act as a variable resistor at the time of the generation of the over-voltage to bypass the over-voltage.

The protective layer 160 may be disposed to cover the discharge portion 150.

In this case, the protective layer 160 may extend from the first surface 1 of the capacitor body 110 to portions of the third and fourth surfaces 3 and 4 and the fifth and sixth surfaces 5 and 6 of the capacitor body 110, and may cover the first to third lead electrodes 141 to 143.

The protective layer 160 may be a component serving to protect the first to third lead electrodes 141 to 143 and the discharge portion 150 from an external environment, in the ESD protecting element, and a material of the protective layer 160 is not particularly limited.

For example, the protective layer 160 may include an insulating resin, for example, at least one of a phenol resin, a silicone resin, and a polyimide resin.

The protective layer 160 may include the epoxy-based resin as described above to protect the first to third lead electrodes 141 to 143 and the discharge portion 150 from external environmental factors such as the permeation of moisture, water, or the like.

That is, in the present exemplary embodiment, since the ESD protecting element is coupled to the outer surface of the capacitor body 110, the protective layer 160 may be a necessary component for protecting the ESD protecting element from the external environment.

The first to fourth conductive resin layers 131 to 134 may be formed on the first to fourth external electrodes 135 to 138, respectively.

The first to fourth conductive resin layers 131 to 134 may include metal particles such as silver (Ag)-epoxy or copper (Cu)-epoxy and a thermosetting resin.

In this case, the first to fourth conductive resin layers 131 to 134 may extend to portions of the first surface of the protective layer 160 in the Z direction, respectively.

Here, the first and second conductive resin layers 131 and 132 may be connected to a signal line or a power line, and the third and fourth conductive resin layers 133 and 134 may be connected to a ground.

That is, the multilayer capacitor and the ESD protecting element may be configured in parallel between the first and second conductive resin layers 131 and 132 and the third and fourth conductive resin layers 133 and 134. Therefore, when an over-voltage of the ESD protecting element, a high voltage in a kV unit, is applied between the signal line and the ground, an instantaneous short circuit may be generated between the signal line and the ground through the ESD protecting element, and a discharge may occur, such that an unnecessary voltage increase may be prevented.

In addition, the first to fourth conductive resin layers 131 to 134 may have elastic force to absorb mechanical stress from an external source, such as stress due to warpage of a board, a thermal impact, or the like, and thus prevent damage to the multilayer capacitor such as a crack of the multilayer capacitor, resulting in an improvement of product reliability.

Meanwhile, the first to fourth conductive resin layers 131 to 134 may be formed at sizes greater than those of the first to fourth external electrodes 135 to 138, respectively, if necessary.

Figure 7:
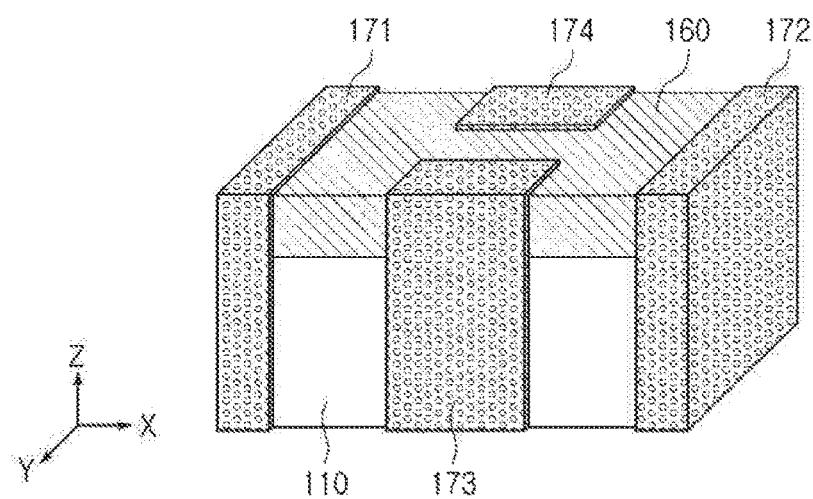
FIG. 7 is a perspective view illustrating that plating layers are further formed in FIG. 1.

Meanwhile, referring to FIG. 7, first and fourth plating layers 171 to 174 may be formed on the first to fourth conductive resin layers 131 to 134, respectively.

The first to fourth plating layers 171 to 174 may include, for example, nickel (Ni) plating layers formed on the first to fourth conductive resin layers 131 to 134 and tin (Sn) plating layers formed on the nickel plating layers, respectively.

In addition, the first to fourth plating layers 171 to 174 may include copper plating layers or gold plating layers, if necessary.

Electronic apparatus manufacturers have made an effort to decrease sizes of printed circuit boards (PCBs) included in electronic apparatuses in order to satisfy consumer demand.

To this end, it has been demanded to increase a degree of integration of ICs mounted on the PCB. According to the exemplary embodiment in the present disclosure, such a demand may be satisfied by configuring one composite component using a plurality of elements.

In addition, according to the exemplary embodiment in the present disclosure, one composite electronic component may be implemented using two components (a three-terminal multilayer capacitor and the ESD protecting element), such that a degree of integration of elements may be improved and one element may be in charge of a noise removing function and an ESD protecting function. Therefore, the number of components and an area of components mounted on a PCB may be reduced.

In the present exemplary embodiment, it may be expected that the area of components mounted on the PCB is reduced by 50% or more as compared to an existing electronic component in which two components are separately configured.

In addition, the composite electronic component according to the present exemplary embodiment may be used in a high speed data line, a universal serial bus (USB) 3.0 or more, a high definition multimedia interface (HDMI), and the like, and may be used in a cable connecting between electronic boards or an external port in products such as a vehicle, a television (TV), and the like.

Since this application has a high data rate, a very high reaction speed, and a high frequency band, the ESD protecting element needs to be appropriate for this application.

That is, in the composite electronic component according to the present exemplary embodiment, the ESD protecting element may be an ESD suppressor that may be used in the high speed data line, the USB 3.0 or more, the HDMI, and the external port having the high data rate, the very high reaction speed, and the high frequency band.

Modified Example

Figure 8:
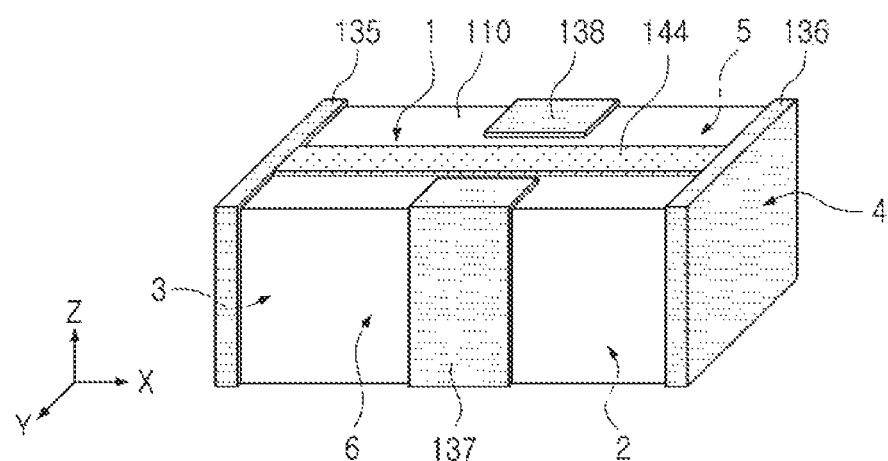
FIG. 8 is a perspective view illustrating that a discharge portion and a protective layer are omitted and a fourth lead electrode is disposed in a composite electronic component according to another exemplary embodiment in the present disclosure.
Figure 9:
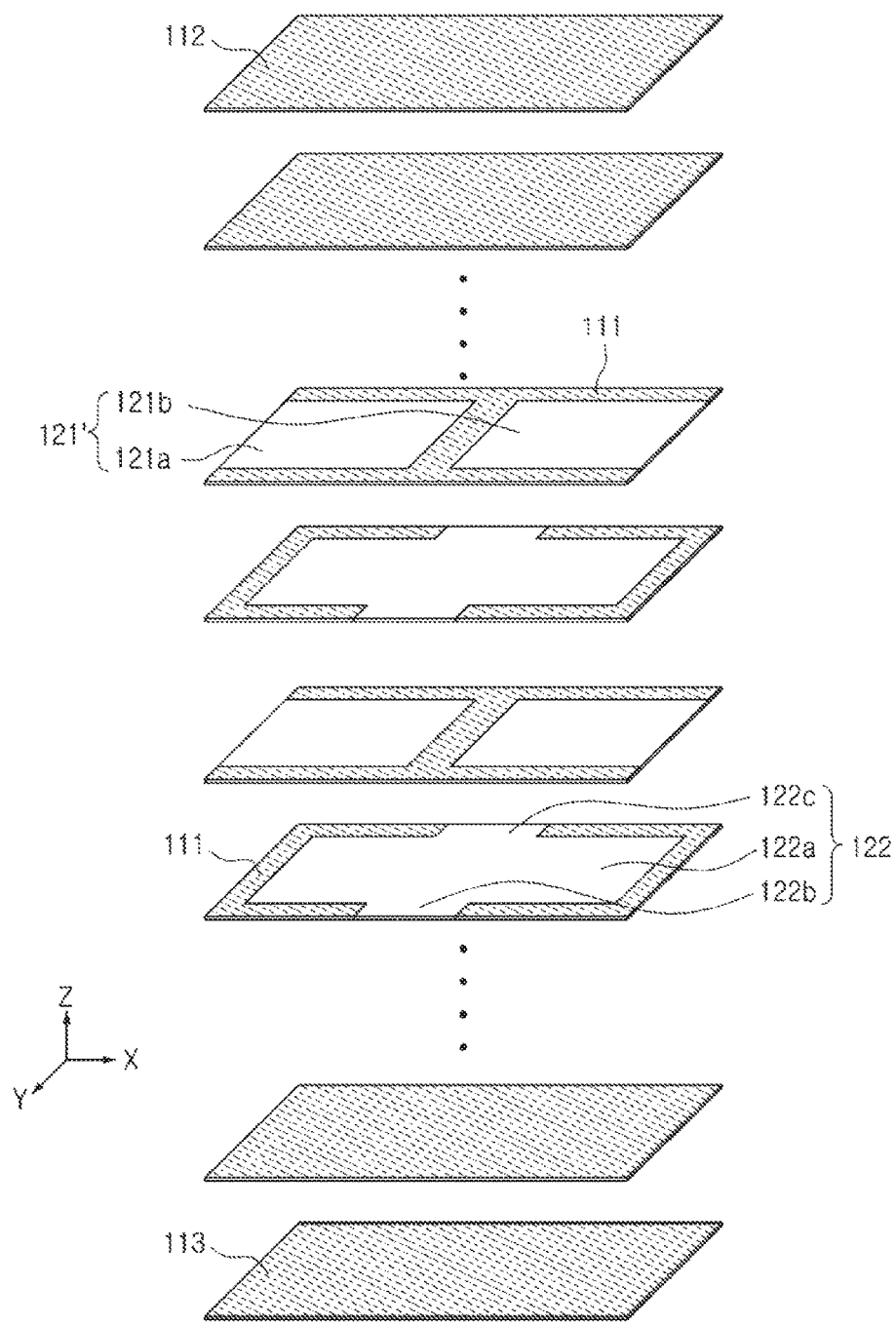
FIG. 9 is a schematic exploded perspective view illustrating structures of first and second internal electrodes in a multilayer capacitor used in FIG. 8.
Figure 10:
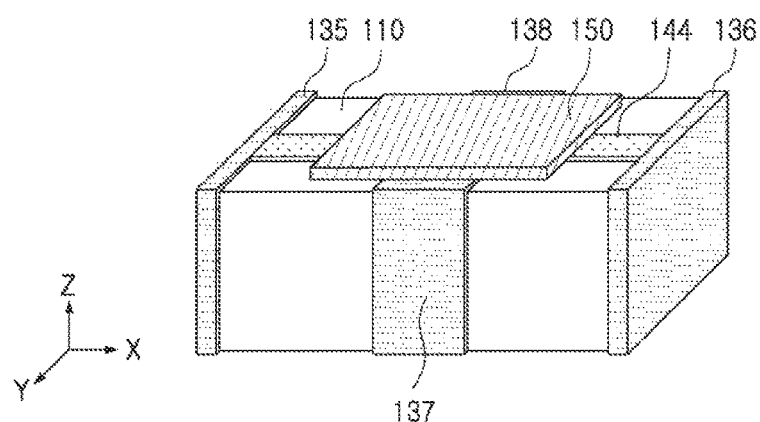
FIG. 10 is a perspective view illustrating a state in which a discharge portion is disposed in FIG. 8.

FIG. 8 is a perspective view illustrating that a discharge portion and a protective layer are omitted and a fourth lead electrode is disposed in a composite electronic component according to another exemplary embodiment in the present disclosure, FIG. 9 is a schematic exploded perspective view illustrating structures of first and second internal electrodes in a multilayer capacitor used in FIG. 8, and FIG. 10 is a perspective view illustrating a state in which a discharge portion is disposed in FIG. 8.

Here, structures of second internal electrodes, first to fourth external electrodes, first to fourth conductive resin layers, and a protective layer are similar to those of the exemplary embodiment described above, and a detailed description therefor will thus be omitted in order to avoid an overlapping description, and first internal electrode, a fourth lead electrode, and a discharge portion having structures different from those of the first internal electrode, the fourth lead electrode, and the discharge portion of the exemplary embodiment described above will be illustrated in the drawings and be described in detail with reference to the drawings.

Referring to FIGS. 8 through 10, first internal electrodes 121' may include first and second internal conductors 121a and 121b spaced apart from each other and exposed through the third and fourth surfaces 3 and 4 of the capacitor body 110, respectively. Therefore, two kinds of capacitances may be formed.

In addition, a fourth lead electrode 144 may be disposed on the first surface 1 of the capacitor body 110.

The fourth lead electrode 144 may connect the first band portion of the first external electrode 135 and the second band portion of the second external electrode 136 to each other, and may not be connected to the third band portion of the third external electrode 137 and the fourth band portion of the fourth external electrode 138. Therefore, the fourth lead electrode 144 may serve as a signal electrode.

Therefore, a discharge portion 150 may be electrically connected to the band portions of the first to fourth external electrodes 135 to 138 in a state in which it covers the fourth lead electrode 144.

Due to such a structure, a direct current (DC) current does not flow in the internal electrodes of the multilayer capacitor. Therefore, heat generation in the multilayer capacitor due to the DC current may be prevented, and deterioration of reliability of the multilayer capacitor due to the heat generation may thus be prevented.

Board Having Composite Electronic Component

Figure 11:
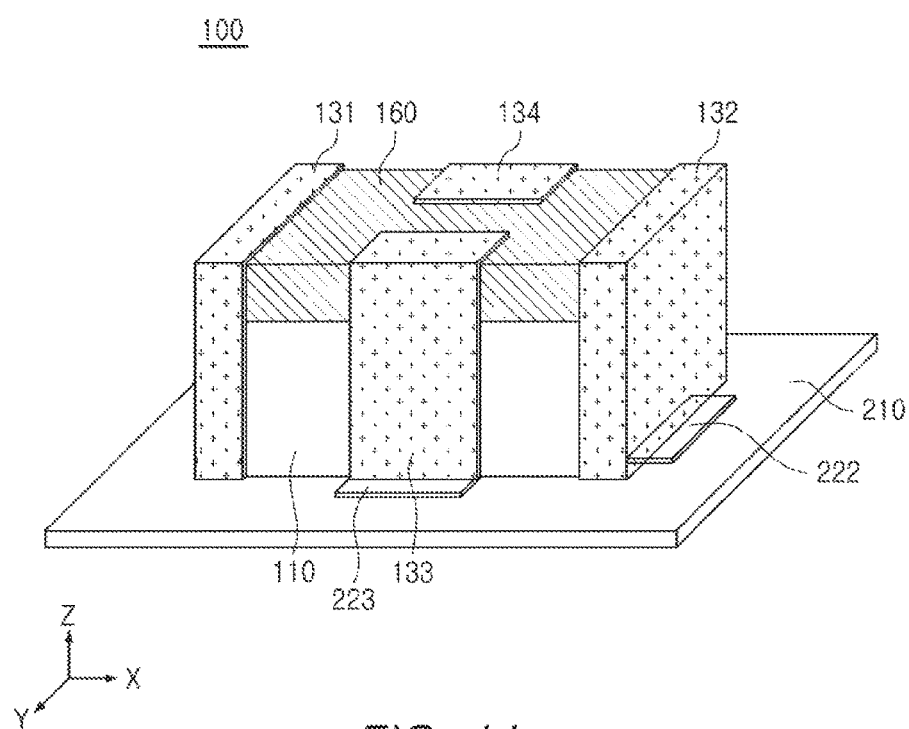
FIG. 11 is a perspective view illustrating a form in which the composite electronic component of FIG. 1 is mounted on a board.
Figure 12:
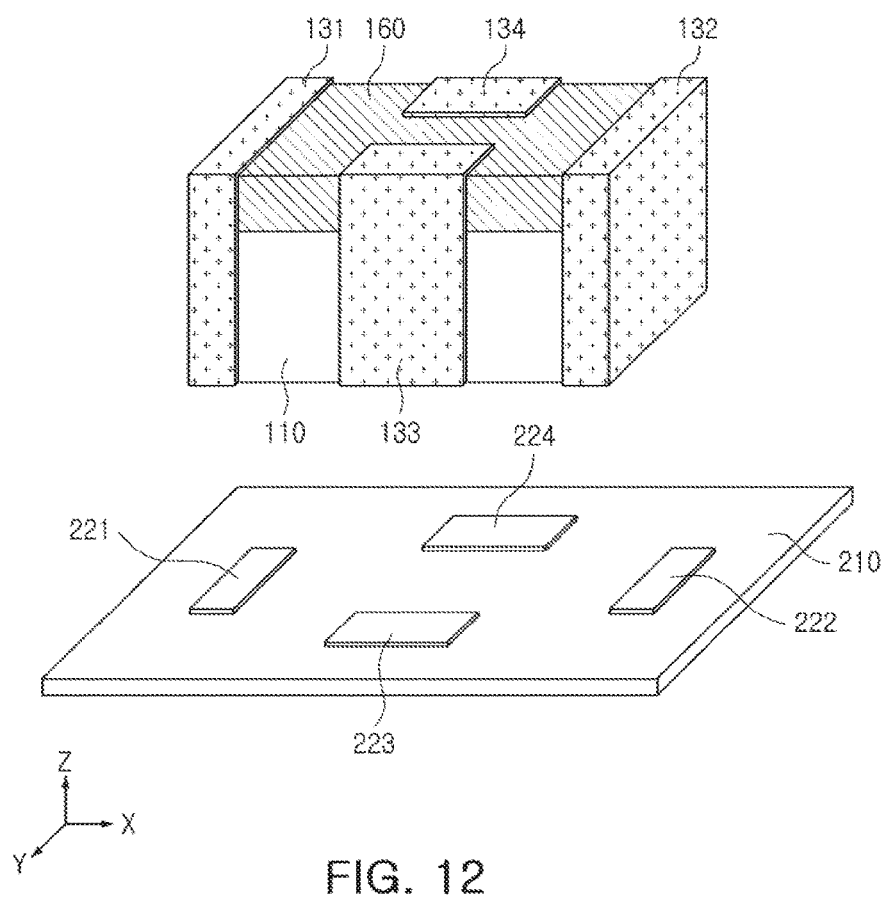
FIG. 12 is an exploded perspective view illustrating the composite electronic component and the board of FIG. 11.

FIG. 11 is a perspective view illustrating a form in which the composite electronic component of FIG. 1 is mounted on a board, and FIG. 12 is an exploded perspective view illustrating the composite electronic component and the board of FIG. 11.

Referring to FIGS. 11 and 12, a board having a composite electronic component according to the present exemplary embodiment may include a circuit board 210 on which the composite electronic component 100 is mounted and a plurality of electrode pads formed on an upper surface of the circuit board 210. Here, the circuit board 210 may be an insulating board, a PCB, or the like.

The electrode pads may include first to fourth electrode pads 221 and 224 electrically connected, respectively, to the first to fourth conductive resin layers 131 to 134 of the composite electronic component 100.

When a voltage applied to the composite electronic component 100 in a state in which the composite electronic component 100 is mounted on the circuit board 210 as described above, acoustic noise may be generated.

In this case, the sizes of the first to fourth electrode pads 221 to 224 may become indices in determining amounts of solders connecting the conductive resin layers of the composite electronic component 100 and the electrode pads to each other, and a magnitude of the acoustic noise may be controlled depending on the amounts of the solders.

The board having a composite electronic component may be used in a decoupling capacitor of a power supply circuit. The decoupling capacitor may absorb a rapid change in a current flowing to a large scale integrated circuit (LSI) and a variation in a voltage generated by an inductance of a wiring to stabilize a power supply voltage.

In addition, the board having a composite electronic component may remove high frequency noise overlapping a signal and absorb ESD generated in power and signal lines to protect the multilayer capacitor.

As set forth above, according to the exemplary embodiments in the present disclosure, a composite electronic component in which an ESD absorbing effect and resistance to ESD are improved, mechanical strength is improved, and a mounting area of a component on a board may be reduced, and a board having the same may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
    a multilayer capacitor;
    an electrostatic discharge (ESD) protecting element; and
    first to fourth conductive resin layers,
    wherein the multilayer capacitor includes:
    a capacitor body including dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, each of the first internal electrodes extending from the third surface to the fourth surface and being exposed through the third and fourth surfaces, and each of the second internal electrodes extending from the fifth surface to the sixth surface and being exposed through the fifth and sixth surfaces;
    first and second external electrodes extending from the third and fourth surfaces of the capacitor body to portions of the first surface of the capacitor body, respectively, and connected to exposed portions of the first internal electrodes; and
    third and fourth external electrodes extending from the fifth and sixth surfaces of the capacitor body to portions of the first surface of the capacitor body, respectively, and connected to exposed portions of the second internal electrodes,
    the ESD protecting element includes:
    first and second lead electrodes disposed on the first surface of the capacitor body to be connected to the first and second external electrodes, respectively;
    a third lead electrode disposed on the first surface of the capacitor body to connect the third and fourth external electrodes to each other, the first and second lead electrodes being spaced apart from the third lead electrode;
    a discharge portion disposed on the first surface of the capacitor body and covering the first to third lead electrodes; and
    a protective layer disposed to cover the discharge portion, and
    the first to fourth conductive resin layers are formed on the first to fourth external electrodes, respectively, and extend to portions of a first surface of the protective layer, respectively.

2. The composite electronic component of claim 1, wherein the first surface of the capacitor body is a mounting surface.

3. The composite electronic component of claim 1, wherein the discharge portion includes a conductive polymer.

4. The composite electronic component of claim 1, wherein the protective layer includes an epoxy-based resin.

5. The composite electronic component of claim 1, further comprising first to fourth plating layers formed on the first to fourth conductive resin layers, respectively.

6. A board having a composite electronic component, comprising:
    a circuit board having electrode pads disposed thereon; and
    the composite electronic component of claim 1 mounted on the circuit board so that the first to fourth external electrodes of the composite electronic component are connected to the electrode pads.

7. The composite electronic component of claim 1, wherein at least a portion of the protective layer is in physical contact with the first surface of the capacitor body.

8. A composite electronic component comprising:
    a multilayer capacitor;
    an electrostatic discharge (ESD) protecting element; and
    first to fourth conductive resin layers,
    wherein the multilayer capacitor includes:
    a capacitor body including dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, each of the first internal electrodes including first and second internal conductors spaced apart from each other and exposed through the third and fourth surfaces of the capacitor body, respectively, and each of the second internal electrodes extending from the fifth surface to the sixth surface and being exposed through the fifth and sixth surfaces;
    first and second external electrodes extending from the third and fourth surfaces of the capacitor body to portions of the first surface of the capacitor body, respectively, and connected to exposed portions of the first internal electrodes; and
    third and fourth external electrodes extending from the fifth and sixth surfaces of the capacitor body to portions of the first surface of the capacitor body, respectively, and connected to exposed portions of the second internal electrodes, the ESD protecting element includes:

a fourth lead electrode disposed on the first surface of the capacitor body to connect the first and second external electrodes to each other and to not in physical contact with the third and fourth external electrodes a discharge portion disposed on the first surface of the capacitor body and covering the fourth lead electrode and the third and fourth external electrodes; and a protective layer disposed to cover the discharge portion, and the first to fourth conductive resin layers are formed on the first to fourth external electrodes, respectively, and extend to portions of a first surface of the protective layer, respectively.

9. The composite electronic component of claim 8, wherein the first surface of the capacitor body is a mounting surface.

10. The composite electronic component of claim 8, wherein the discharge portion includes a conductive polymer.

11. The composite electronic component of claim 8, wherein the protective layer includes an epoxy-based resin.

12. The composite electronic component of claim 8, further comprising first to fourth plating layers formed on the first to fourth conductive resin layers, respectively.

13. A board having a composite electronic component, comprising:

a circuit board having electrode pads disposed thereon; and the composite electronic component of claim 8 mounted on the circuit board so that the first to fourth external electrodes of the composite electronic component are connected to the electrode pads.

14. The composite electronic component of claim 8, wherein at least a portion of the protective layer is in physical contact with the first surface of the capacitor body.

\* \* \* \* \*